(12) United States Patent
Chang (10) Patent No.: US 8,415,566 B2
(45) Date of Patent: Apr. 9, 2013

(54) ELECTRODE OF BIOSENSOR, MANUFACTURING METHOD THEREOF, AND BIOSENSOR THEREOF

(75) Inventor: Yen Hsiang Chang, Taoyuan (TW)

(73) Assignee: Biosensors Electrode Technology Co., Ltd., Taoyuan (TW)

( * ) Notice: Subject to any disclaimer, the term of this patent is extended or adjusted under 35 U.S.C. 154(b) by 340 days.

(21) Appl. No.: 12/793,703

(22) Filed: Jun. 4, 2010

(65) Prior Publication Data

US 2011/0139491 A1    Jun. 16, 2011

(30) Foreign Application Priority Data

Dec. 15, 2009   (TW) .............................. 98143002 A (51) Int. Cl.
*H05K 1/03*            (2006.01)
(52) U.S. Cl.
USPC .......................................... 174/255; 174/261
(58) Field of Classification Search .......... 174/255–261; 361/777–779
See application file for complete search history.

(56) References Cited

U.S. PATENT DOCUMENTS 6,977,180 B2     12/2005 Hellinga et al.
2009/0057149 A1   3/2009 Wegner et al.

OTHER PUBLICATIONS

Office Action issued Sep. 26, 2012 to the corresponding TW patent application No. 099112999 cites: thesis by Chen, Chun-Ho, US20090057149 and US6977180.
English translation of Office Action issued Sep. 26, 2012 to the corresponding TW patent application No. 099112999.
Chen, Chun-Ho, "Development and Fabrication of Glucose Micro-Biosensor", Nov. 2003, National Ynlin University of Science and Technology. (English Abstract p. 7).

*Primary Examiner* — Jeremy Norris
(74) *Attorney, Agent, or Firm* — WPAT, P.C.; Anthony King (57) ABSTRACT

The present invention discloses an electrode of a biosensor, a manufacturing method thereof, and a biosensor thereof. The electrode of the biosensor comprises a flexible insulation layer, a resin layer, a first metal layer, a second metal layer, a third metal layer and a fourth metal layer. The resin layer is disposed between the flexible insulating layer and the first metal layer. The second metal layer is disposed between the first metal layer and the third metal layer, and the fourth metal layer is disposed on the third metal layer. The material of the first metal layer comprises copper foil. The material of the second metal layer comprises palladium. The material of the third metal layer comprises nickel, and the material of the fourth metal layer comprises gold or palladium. The electrode further comprises a biological active substance immobilized on the surface of the plurality of metal layers.

11 Claims, 11 Drawing Sheets

ELECTRODE OF BIOSENSOR, MANUFACTURING METHOD THEREOF, AND BIOSENSOR THEREOF

FIELD OF THE INVENTION

The present invention relates to an electrode, and a biosensor thereof; and more particularly, to an electrode of a biosensor, a manufacturing method thereof, and a biosensor thereof.

BACKGROUND OF THE INVENTION

A detection and diagnosis technologic industry refers to detect and diagnose products utilized to collect, prepare, examine, and analyze samples. These products comprise reagents, drugs, apparatuses, or other auxiliary devices. Generally, most of diagnostic reagents are used in vitro, and the samples thereof may be urine, feces, blood, saliva, and other body fluids of an animal, or plant tissue fluids. In the domestic market, these products majorly relate to medical examinations, comprising blood glucose or uric acid testing strips, hepatitis B or C testing reagents, HIV testing reagents, pregnancy diagnosis strips, enterovirus testing reagents, or cholesterol, triglyceride or urine enzyme immunoassay strips.

The incidence rates of diabetes mellitus (DM), hypercholesterolemia or gout are increasing year after year. In addition to control of diet and drugs for patients with DM or gout, the most important is self-monitoring. Thus, blood glucose, cholesterol, or uric acid testing strips are important for said patients.

Recently, for manufacturers of blood glucose meters in Taiwan, electrodes of biosensors are all manufactured by a screen printing procedure, and the material of said electrodes is majorly carbon or silver. Each batch of electrodes produced via the screen printing procedure has the following disadvantages.

(1) The production quality is unstable, and the defective rate defined to be a ratio of the defective number to the total number of products is in a range of 10 to 20%, which might increase the production costs.

(2) The resistance value of each said electrode is not easy to effectively control, bringing about the increase of the coefficient of variation (CV).

(3) There is poor accuracy in the determination of said electrodes.

(4) There is need for code cards to calibrate said electrodes before the determination, causing cost increase and inconvenience for users.

(5) The carbon electrode has a high resistance value, increasing the cost of the power supply thereof.

(6) The reaction of said electrodes takes longer time, which is about 10~15 seconds.

SUMMARY OF THE INVENTION

In view of the aforementioned drawbacks in the prior art, an object of the present invention is to provide an electrode of a biosensor, a manufacturing method thereof, and a biosensor thereof, so as to solve unstable quality of batches of productions and enhance the sensitivity of the electrode.

The first aspect of the present invention is to provide an electrode of a biosensor comprising a flexible insulation layer, a resin layer, a first metal layer, a second metal layer, a third metal layer and a fourth metal layer. The resin layer is disposed between the flexible insulation layer and the first metal layer. The second metal layer is disposed between the first metal layer and the third metal layer, and the fourth metal layer is disposed on the third metal layer. Wherein, the material of the first metal layer comprises copper foil, brass, tombac, phosphorous copper, silver or a combination thereof. The material of the second metal layer comprises palladium. The material of the third metal layer comprises nickel, and the material of the fourth metal layer comprises gold or palladium.

The second aspect of the present invention is to provide a manufacturing method of the electrode of the biosensor, comprising the following steps. A flexible insulation layer is provided, and a resin layer is disposed on the flexible insulation layer. A first metal layer is disposed on the surface of the resin layer, and a circuit to be wanted is etched on the first metal layer via a microetching procedure. Further, a second metal layer, a third metal layer and a fourth metal layer are respectively disposed on the first metal layer comprising the circuit. Wherein, the material of the first metal layer comprises copper foil, brass, tombac, phosphorous copper, silver or a combination thereof. The material of the second metal layer comprises palladium. The material of the third metal layer comprises nickel, and the material of the fourth metal layer comprises gold or palladium.

The third aspect of the present invention is to provide a biosensor comprising an electrode, a bioactive material and at least one plate. The at least one plate is disposed on the electrode, and comprises an opening at an end thereof to put samples to be analyzed, such as blood. The electrode comprises a flexible insulation layer, a resin layer, a first metal layer, a second metal layer, a third metal layer and a fourth metal layer. The resin layer is disposed between the flexible insulation layer and the first metal layer. The second metal layer is disposed between the first metal layer and the third metal layer, and the fourth metal layer is disposed on the third metal layer. The material of the first metal layer comprises copper foil, brass, tombac, phosphorous copper, silver or a combination thereof. The material of the second metal layer comprises palladium. The material of the third metal layer comprises nickel, and the material of the fourth metal layer comprises gold or palladium. The bioactive material is immobilized on the surface of the fourth metal layers. When blood is reacted with the bioactive material to perform an electrochemical reaction, the specific substance in the blood can be detected. For example, if the bioactive material is glucose oxidase, the concentration of glucose in the blood can be obtained.

Accordingly, the electrode of the biosensor, the manufacturing method thereof, and the biosensor thereof according to the present invention may provide one or more of the following advantages:

(1) According to the electrode of the present invention, the palladium layer disposed between the copper foil layer and the nickel layer to result in closely adhering to each other. Thus, stable metals, such as gold, are easy plated on the nickel layer via an electrolytic deposition method. The data obtained from the electrode made of gold are more accurate than those from an electrode made of carbon or silver.

(2) In the manufacturing method of the electrode of the present invention, a circuit to be wanted is etched by a photolithography microetching process, capable of increasing the production quality and decreasing the defective rate to 0~3%.

(3) The users do not need the code cards while using the electrode of the present invention so as to decrease the costs and increase convenience.

(4) The electrode of the present invention has a low resistance property, such that the reaction thereof takes short time and the voltage is very low to save energy.

(5) The electrode of the present invention has the same detecting functions for any biological materials, which can establish a good foundation of the biotechnology detecting industry, achieve a breakthrough technologic development, and expand business opportunities to foreign markets.

(6) The electrode of the present invention can be used by patients with diabetes mellitus, hypercholesterolemia or gout to accurately detect blood glucose, cholesterol or uric acid of the patients.

BRIEF DESCRIPTION OF THE DRAWINGS

The structure and the technical means adopted by the present invention to achieve the above object can be best understood by referring to the following detailed description of the preferred embodiments and the accompanying drawings, wherein.

DETAILED DESCRIPTION OF THE PREFERRED EMBODIMENTS

Those of ordinary skilled in the art will realize that the following detailed description of the exemplary embodiments is illustrative only and is not intended to be in any way limiting. Other embodiments will readily suggest themselves to such skilled persons having the benefit of this disclosure. Reference will now be made in detail to implementations of the exemplary embodiments as illustrated in the accompanying drawings. The same reference indicators will be used throughout the drawings and the following detailed description to refer to the same or like parts.

Figure 1:
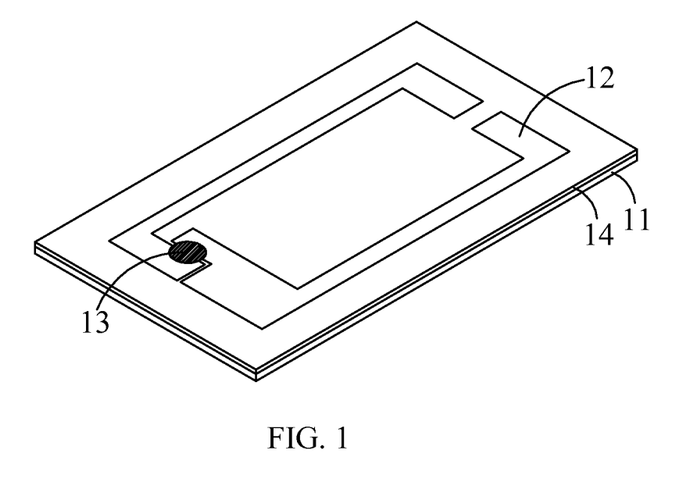
FIG. 1 is a stereogram illustrating an electrode of a biosensor according to an embodiment of the present invention.
Figure 2:
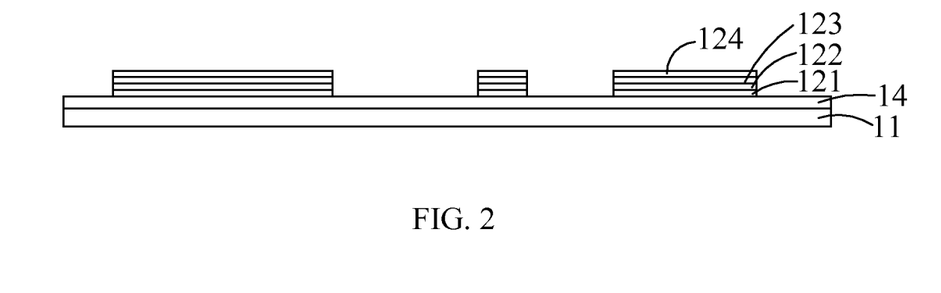
FIG. 2 is a cross-sectional diagram illustrating the electrode of the biosensor according to an embodiment of the present invention.
Figure 3:
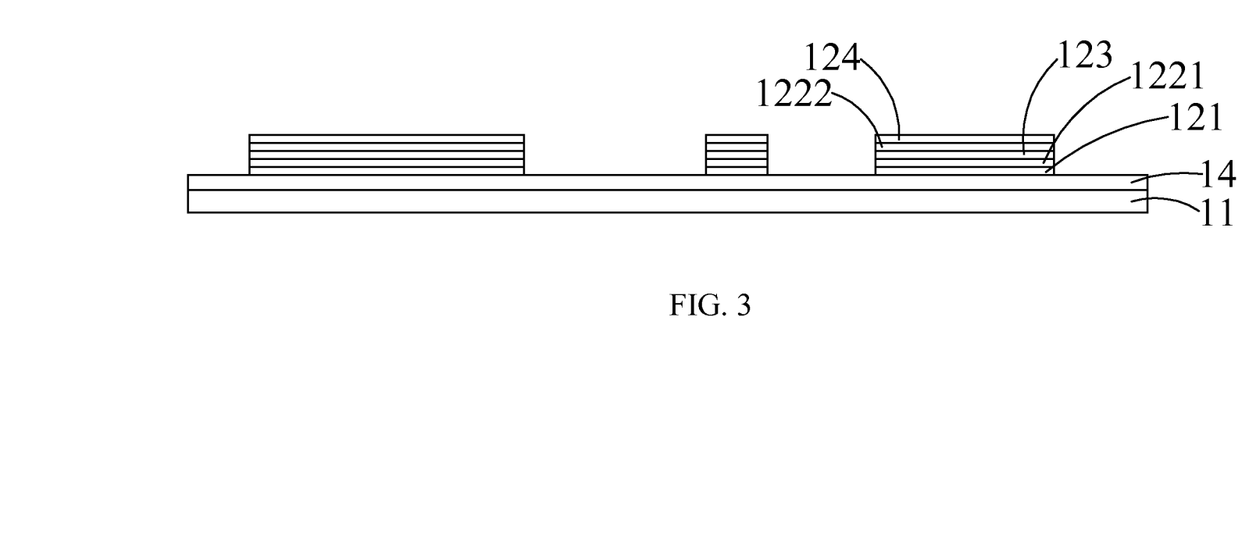
FIG. 3 is a cross-sectional diagram illustrating an electrode of a biosensor according to another embodiment of the present invention.

Please refer to FIG. 1 and FIG. 2 that are respectively a stereogram illustrating an electrode of a biosensor, and a cross-sectional diagram of the electrode of the biosensor according to an embodiment of the present invention. In shown, the electrode comprises a flexible insulation layer 11, a resin layer 14, and a plurality of metal layers 12. The plurality of metal layers 12 comprise a first metal layer, a second metal layer, a third metal layer and a fourth metal layer. The second metal layer is disposed between the first metal layer and the third metal layer, and the fourth metal layer is disposed on the third metal layer. The resin layer 14 is disposed between the flexible insulation layer 11 and the plurality of metal layers 12. The material of the first metal layer comprises copper foil, brass, tombac, phosphorous copper, silver or a combination thereof. The tombac may be an alloy of copper and zinc. The material of the second metal layer comprises palladium. The material of the third metal layer comprises nickel, and the material of the fourth metal layer comprises gold or palladium. In this embodiment, the material of the first metal layer is copper foil, and the first metal layer, the second metal layer, the third metal layer and the fourth metal layer are a copper foil layer 121, a palladium layer 122, a nickel layer 123, and a gold layer 124, respectively. The plurality of metal layers 12 are formed by a plating method comprising an evaporation deposition method, a sputter deposition method, a chemical deposition method, or an electrolytic deposition method. Additionally, from the bottom to the top of the plurality of metal layers 12, the metals thereof may sequentially be copper foil, palladium, nickel, palladium and gold to sequentially form a copper foil layer 121, a first palladium layer 1221, a nickel layer 123, a second palladium layer 1222 and a gold layer 124, as shown in FIG. 3.

Preferably, the electrode of the present invention may comprise a bioactive material 13 immobilized on the surface of the fourth metal layer. The bioactive material 13 is easily immobilized on the gold layer 124, which is detected stably by an electrochemical analysis, such that the gold layer 124 may be disposed on the surface of the nickel layer 123 (i.e. the top layer of the plurality of metal layers 12 is the gold layer 124).

Wherein, a material of the flexible insulation layer 11 comprises polymide (PI), polyvinyl chloride (PVC), polypropylene (PP), or flame retardant 4 (FR4). Preferably, the material of the flexible insulation layer 11 may be polyethylene terephthalate (PET). The thickness of the flexible insulation layer 11 is in a range of 0.05 to 1 mm. The thicknesses of the first metal layer, the second metal layer, the third metal layer and the fourth metal layer may be in a range from 0.001 to 0.5 mm, 0.01 to 5 micro-inches, 10 to 200 micro-inches and 0.5 to 10 micro-inches, respectively. The resin of the resin layer 14 comprises phosphorus epoxy, and the thickness thereof is in a range of 0.001 to 0.1 mm. The plurality of metal layers 12 not only comprise the copper foil layer 121, the palladium layer 122, the nickel layer 123, and the gold layer 124, but also comprise a platinum layer, a chromium layer or a rhodium layer. The bioactive material comprises an enzyme, an antigen or an antibody, and the enzyme may comprise glucose oxidase, cholesterol esterase, cholesterol oxidase or uricase.

Figure 4:
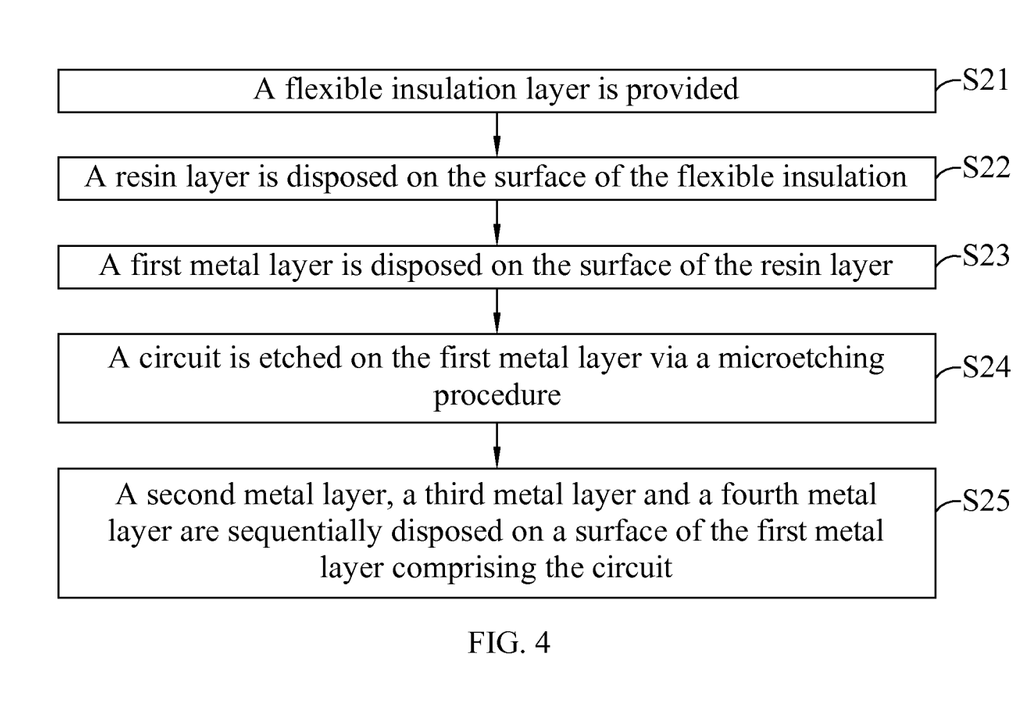
FIG. 4 is a flowchart illustrating a manufacturing method of an electrode of a biosensor according to a first embodiment of the present invention.
Figure 5:
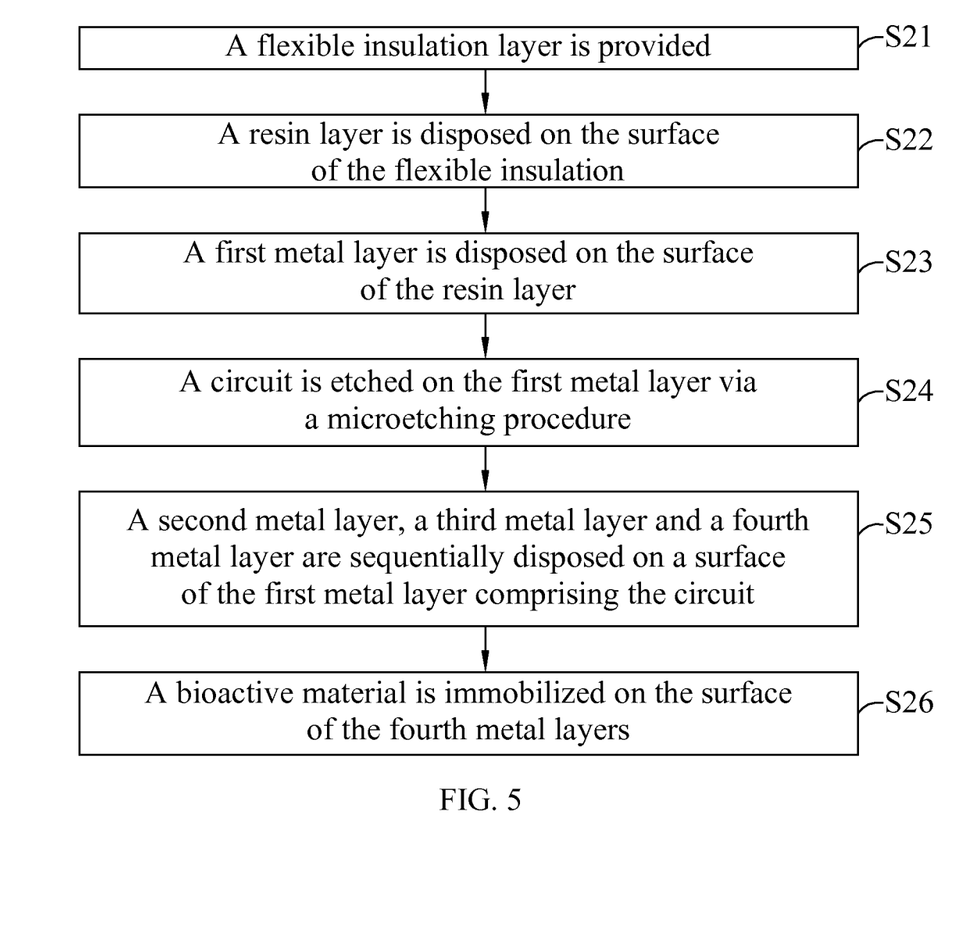
FIG. 5 is a flowchart illustrating a manufacturing method of an electrode of a biosensor according to a second embodiment of the present invention.

Please refer to FIG. 4 that is a flowchart illustrating a manufacturing method of an electrode of a biosensor according to a first embodiment of the present invention. The steps comprise the follows. In the step S21, a flexible insulation layer is provided. In the step S22, a resin layer is disposed on the surface of the flexible insulation. In the step S23, a first metal layer on the surface of the resin layer. In the step S24, a circuit is etched on the first metal layer via a microetching procedure. In the step S25; a second metal layer, a third metal layer and a fourth metal layer are sequentially disposed on the first metal layer comprising the circuit. The material of the first metal layer comprises copper foil, brass, tombac, phosphorous copper, silver or a combination thereof. The tombac may be an alloy of copper and zinc. The material of the second metal layer comprises palladium. The material of the third metal layer comprises nickel, and the material of the fourth metal layer comprises gold or palladium. Preferably, the step S26 may be added behind the step S25. In the step S26, a bioactive material is immobilized on the surface of the fourth metal layers, as shown in FIG. 5.

Figure 6:
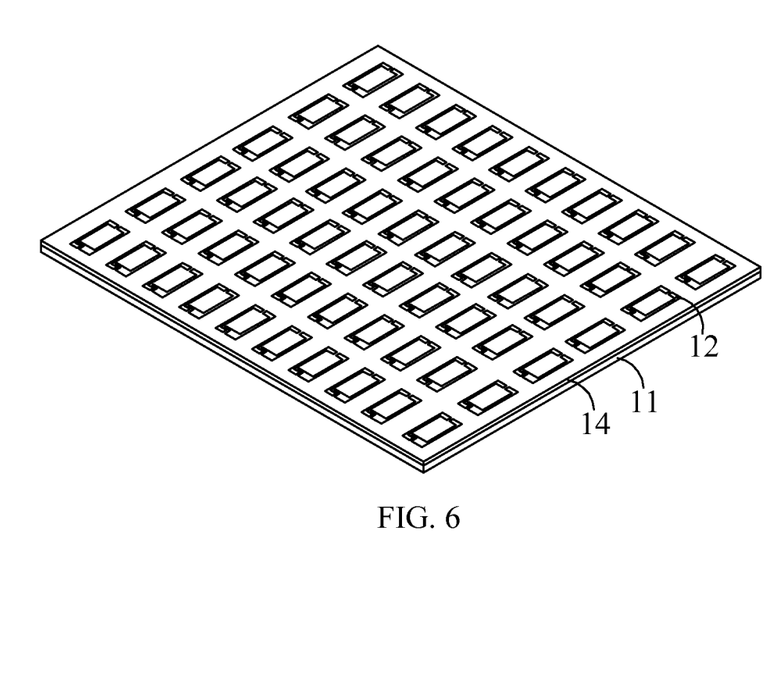
FIG. 6 is a schematic diagram illustrating an entire piece of a flexible insulation layer etched with a plurality circuits according to the present invention.

The electrode produced by the microetching method may be an entire piece of the flexible insulation layer 11 etched with a plurality of circuits, as shown in FIG. 6. The entire piece of the flexible insulation layer 11 etched with a plurality of circuits is completely immersed in gold solution. Each metal layer is disposed on the first metal layer by an evaporation deposition method, a sputter deposition method, a chemical deposition method, or an electrolytic deposition method. The material of the first metal layer may further comprise nickel, gold, palladium, rhodium, platinum or chromium. A material of the flexible insulation layer 11 may comprise polymide (PI), polyvinyl chloride (PVC), polypropylene (PP), or flame retardant 4 (FR4), and preferably, may be polyethylene terephthalate (PET). The thickness of the flexible insulation layer 11 is in a range of 0.05 to 1 mm. The resin of the resin layer 14 may comprise phosphorus epoxy, and the thickness thereof is in a range of 0.001 to 0.1 mm. The thicknesses of the first metal layer, the second metal layer, the third metal layer and the fourth metal layer may be in a range from 0.001 to 0.5 mm, 0.01 to 5 micro-inches, 10 to 200 micro-inches and 0.5 to 10 micro-inches, respectively. The bioactive material 13 is easily immobilized on the gold layer 124, such that samples are reacted stably with the bioactive material 13. Therefore, the gold layer 124 can be disposed on the surface of the nickel layer 123 (i.e. the top layer of the plurality of metal layers 12 is the gold layer 124). The bioactive material comprises an enzyme, an antigen or an antibody, and the enzyme may comprise glucose oxidase, cholesterol esterase, cholesterol oxidase or uricase.

Figure 7:
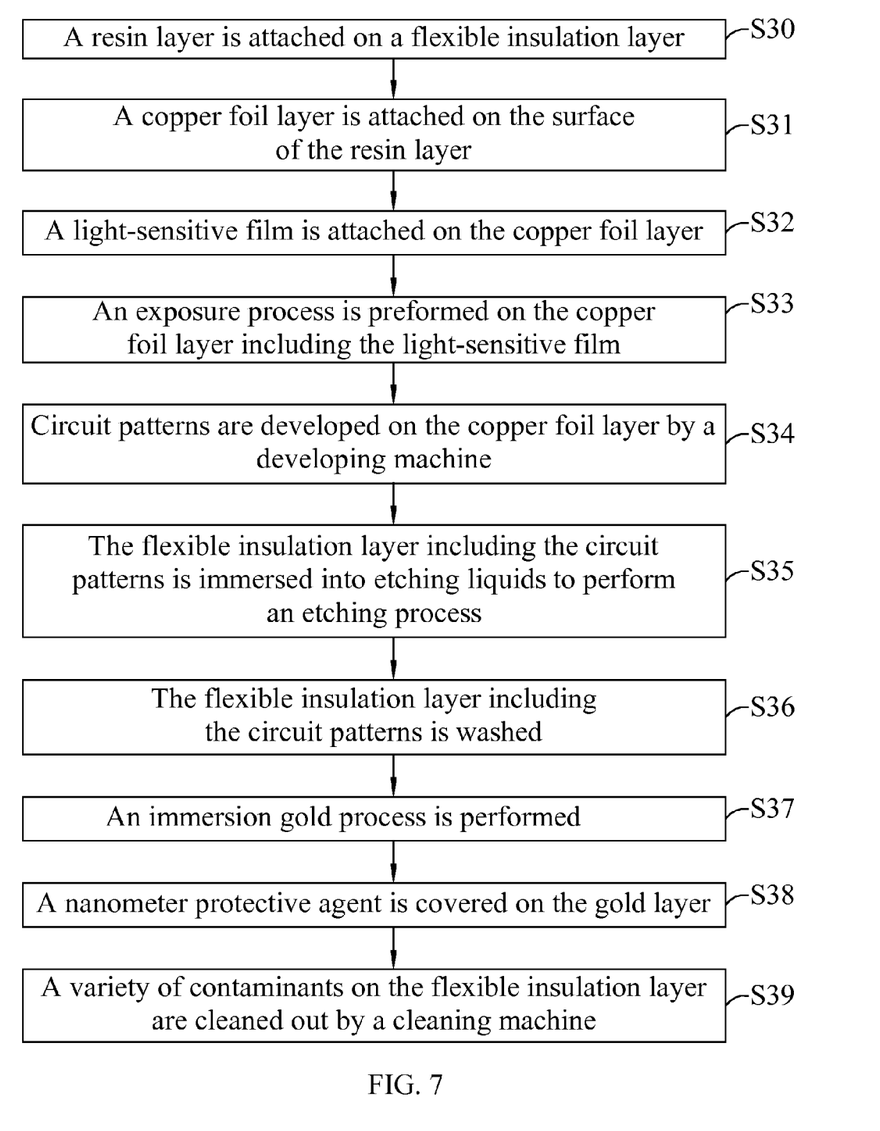
FIG. 7 is a flowchart illustrating a manufacturing method of an electrode according to a third embodiment of the present invention.

Please refer to FIG. 7, a flowchart illustrating a manufacturing method of an electrode according to a third embodiment of the present invention is shown. The steps of the manufacturing method comprise the follows. In the step S30, a resin layer is attached on a flexible insulation layer. In the step S31, a copper foil layer is attached on the surface of the resin layer. In the step S32, a light-sensitive film, which is a photoresist comprising circuit patterns to be wanted, is attached on the copper foil layer. In the step S33, an exposure process is preformed on the copper foil layer including the light-sensitive film. In the step S34, circuit patterns are developed on the copper foil layer by a developing machine. In the step S35, the flexible insulation layer including the circuit patterns is immersed into etching liquids to perform an etching process. In the step S36, the flexible insulation layer including the circuit patterns is washed. In the step S37, via an immersion gold process, palladium, nickel and gold are sequentially planted on the copper foil layer to respectively form a palladium layer, a nickel layer, and a gold layer. In the step S38, a nanometer protective agent is covered on the gold layer. In the step S39, a variety of contaminants on the flexible insulation layer are cleaned out by a cleaning machine to obtain the electrode of the present invention.

Additionally, the nanometer protective agent has excellent anti-acid, anti-alkali and abrasion resistance properties, such that the nanometer protective agent is used after plating gold. The cleaning machine may be a plasma cleaning machine or high-pressure cleaning machine. The quality of the electrode of the present invention can be checked by a magnifier, a coating adhesion test, or an optical biopsy. The results indicate that the defective rate of the electrode of the present invention is lower than that of the carbon electrode produced by the traditional screen printing. The defective rate of the electrode according to the present invention is only in a range of 0 to 3%.

Figure 8:
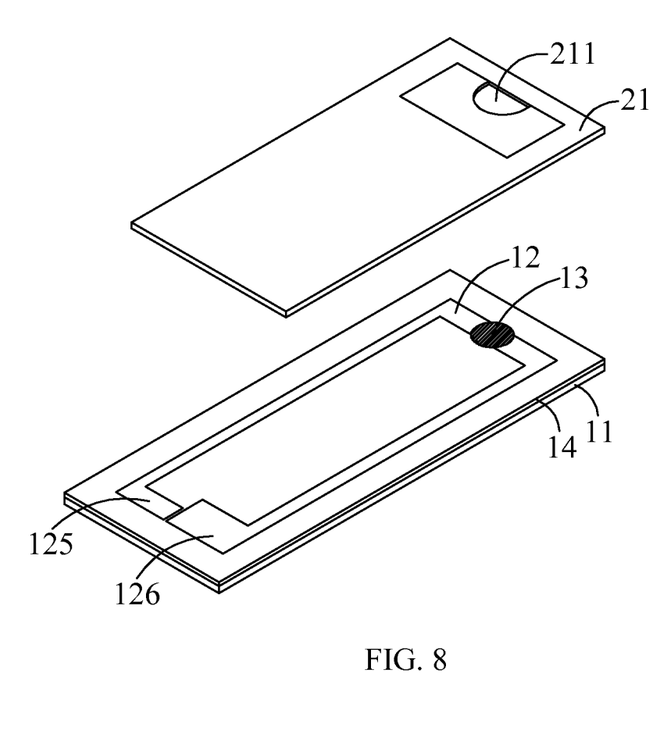
FIG. 8 is a breakdown drawing of a biosensor according to an embodiment of the present invention.

Please refer to FIG. 8 that is a breakdown drawing of a biosensor according to an embodiment of the present invention. In shown, the biosensor comprises an electrode, a bioactive material 13 and at least one plate 21. The at least one plate 21 may be disposed on the electrode, and at least one opening is disposed at an end of the plate 21 to put samples to be analyzed, such as blood. The electrode comprises a flexible insulation layer 11, a resin layer 14 and a plurality of metal layers 12. The plurality of metal layers 12 comprise a first metal layer, a second metal layer, a third metal layer and a fourth metal layer. The second metal layer is disposed between the first metal layer and the third metal layer, and the fourth metal layer is disposed on the third metal layer. The resin layer 14 is disposed between the flexible insulation layer 11 and the plurality of metal layers 12. The material of the first metal layer comprises copper foil, brass, tombac, phosphorous copper, silver or a combination thereof. The tombac may be an alloy of copper and zinc. The material of the second metal layer comprises palladium. The material of the third metal layer comprises nickel, and the material of the fourth metal layer comprises gold or palladium. While the material of the first metal layer is copper foil, the first metal layer, the second metal layer, the third metal layer and the fourth metal layer are a copper foil layer 121, a palladium layer 122, a nickel layer 123, and a gold layer 124, respectively. A bioactive material 13 is immobilized on the surface of the fourth metal layer. When blood is reacted with the bioactive material 13 to perform an electrochemical reaction, the specific substance in the blood is detected. For example, if the bioactive material 13 is glucose oxidase, the concentration of glucose in the blood can be obtained. The fourth metal layer may be the gold layer 124. Because the bioactive material 13 is easily immobilized on the gold layer 124, samples are reacted stably with the bioactive material 13. The thickness of copper foil layer 121, the palladium layer 122, the nickel layer 123 and the gold layer 124 are in a range of 0.001 to 0.5 mm, 0.01 to 5 micro-inches, 10 to 200 micro-inches, and 0.5 to 10 micro-inches, respectively.

Preferably, the electrode of the present invention may comprise a reference electrode 125 and a working electrode 126. The voltage of the working electrode is majorly set by the reference electrode 125. The materials and thicknesses of the flexible insulation layer 11 and the resin layer 11, the bioactive material 13, and the plating method are the same as the above description, thus not being repeated herein.

Figure 9:
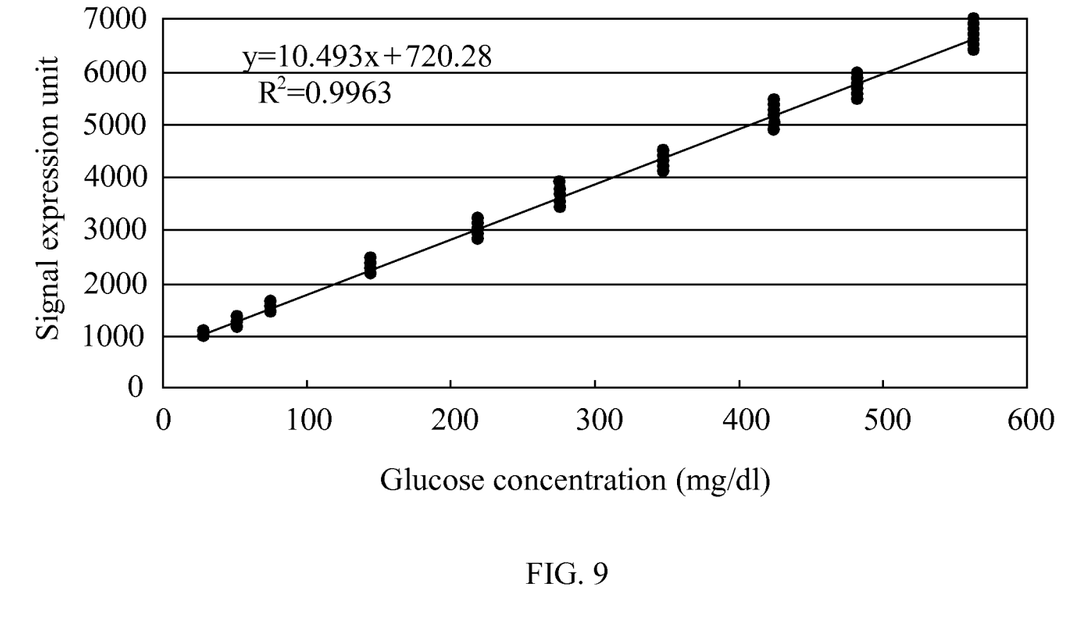
FIG. 9 is a linear diagram illustrating glucose concentrations detected by a biosensor according to the present invention.
Figure 10:
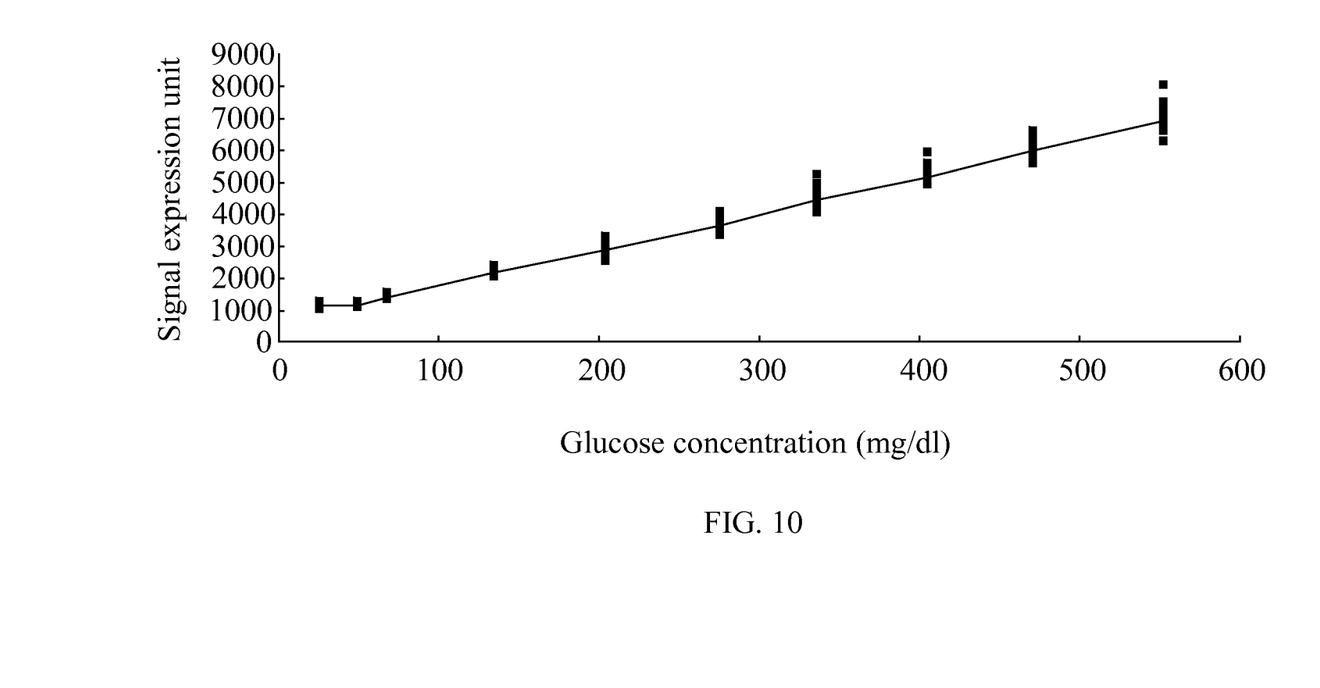
FIG. 10 is a nonlinear diagram illustrating glucose concentrations detected by a biosensor having a carbon/silver electrode.
Figure 11:
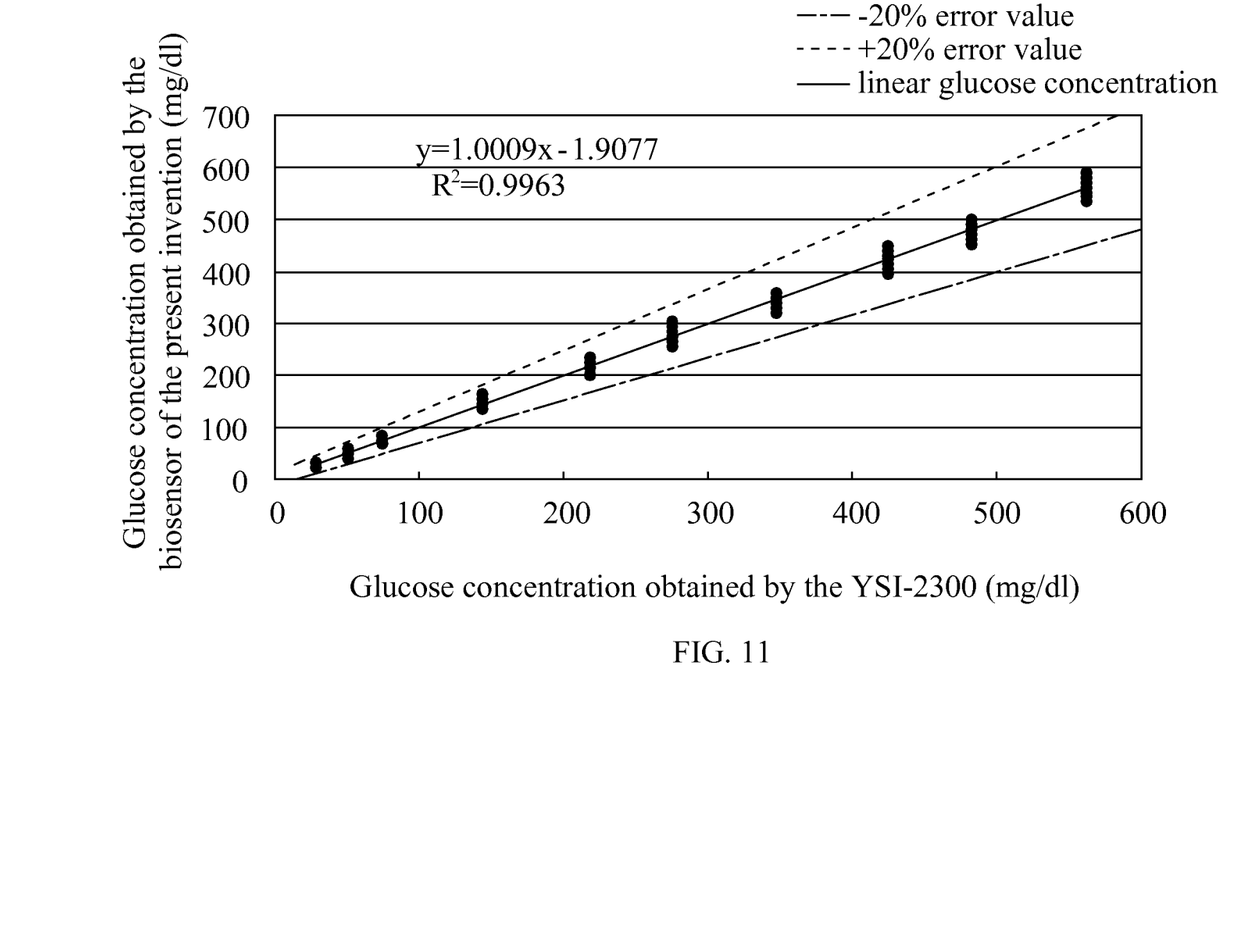
FIG. 11 is a linear diagram illustrating the glucose concentration detected by a biosensor according to the present invention corresponding to the glucose concentration detected by an YSI-2300.

Compared with the carbon electrode produced by the screen printing, the electrode of the present invention has a low electric resistance. The electric resistance of the carbon electrode produced by the screen printing is about 200 to 500 ohm, and the electric resistance of the electrode of the present invention is only in a range of 0.01 to 10 ohm. The carbon electrode produced by the screen printing needs a high potential, which is about 0.03 to 0.5 volts. The potential of the electrode of the present invention is about 0.08 to 0.2 volts. Therefore, the carbon electrode produced by the screen printing takes more the reaction time to reach the equilibrium state, and the electrode of the present invention only takes 2 to 8 seconds to reach the equilibrium state. When the electrode of the present invention is used to detect the glucose concentrations, the slope of the low glucose concentrations is highly consistent with the slope of the high glucose concentrations, as shown in FIG. 9. There is a large difference between the slopes of the low glucose concentrations and the high glucose concentrations detected by the carbon electrode, as shown in FIG. 10. Furthermore, the glucose concentrations detected by the electrode of the present invention is compared with the glucose concentrations detected by the BMG and the YSI-2300. The data thereof indicate the coefficient of variation (CV %) could be kept at below 3% while the glucose concentration is over 300 mg/dl. When the glucose concentration is in a range of 75 to 300 mg/dl and below 75 mg/dl, the CV % thereof could be kept at below 4% and 5%, respectively, as shown in FIG. 11. The results as set forth show the electrode of the present invention is very stable to detect any bioactive materials.

The present invention has been described with some preferred embodiments thereof and it is understood that many changes and modifications in the described embodiments can be carried out without departing from the scope and the spirit of the invention that is intended to be limited only by the appended claims.

What is claimed is:

1. An electrode of a biosensor, comprising:
   a flexible insulation layer;
   a resin layer disposed on a surface of the flexible insulation layer;
   a first metal layer disposed on the resin layer;
   a second metal layer disposed on the first metal layer;
   a third metal layer disposed on the second metal layer; and
   a fourth metal layer disposed on the third metal layer;
   wherein a material of the first metal layer comprises copper foil, brass, tombac, phosphorous copper, silver or a combination thereof; a material of the second metal layer comprises palladium; a material of the third metal layer comprises nickel; and a material of the fourth metal layer comprises gold or palladium.

2. The electrode of the biosensor as claimed in claim 1, further comprising a bioactive material immobilized on a surface of the fourth metal layer.

3. The electrode of the biosensor as claimed in claim 2, wherein the bioactive material comprises an enzyme, an antigen or an antibody, and the enzyme comprises glucose oxidase, cholesterol esterase, cholesterol oxidase or uricase.

4. The electrode of the biosensor as claimed in claim 1, wherein a material of the flexible insulation layer comprises polyethylene terephthalate, polymide, polyvinyl chloride, polypropylene or flame retardant 4 (FR4), and resin in the resin layer comprises phosphorus epoxy.

5. The electrode of the biosensor as claimed in claim 1, wherein a thickness of the flexible insulation layer is in a range of 0.05 to 1 mm, and a thickness of the resin layer is in a range of 0.001 to 0.1 mm.

6. The electrode of the biosensor as claimed in claim 1, wherein the first metal layer, the second metal layer, the third metal layer and the fourth metal layer are formed by a plating method, and the plating method comprises a evaporation deposition method, a sputter deposition method, a chemical deposition method, or an electrolytic deposition method.

7. A biosensor, comprising:
   an electrode, comprising:
   a flexible insulation layer;
   a resin layer disposed on a surface of the flexible insulation layer;
   a first metal layer disposed on the resin layer;
   a second metal layer disposed on the first metal layer;
   a third metal layer disposed on the second metal layer;
   a fourth metal layer disposed on the third metal layer; and
   a bioactive material immobilizing on a surface of the fourth metal layer; and
   at least one plate disposed on the electrode, an end of the at least one plate provided with an opening;
   wherein a material of the first metal layer comprises copper foil, brass, tombac, phosphorous copper, silver or a combination thereof; a material of the second metal layer comprises palladium; a material of the third metal layer comprises nickel; and a material of the fourth metal layer comprises gold or the palladium.

8. The biosensor as claimed in claim 7, wherein a material of the flexible insulation layer comprises polyethylene terephthalate, polymide, polyvinyl chloride, polypropylene or flame retardant 4 (FR4), and resin in the resin layer comprises phosphorus epoxy.

9. The biosensor as claimed in claim 7, wherein the bioactive material comprises an enzyme, an antigen or an antibody, and the enzyme comprises glucose oxidase, cholesterol esterase, cholesterol oxidase or uricase.

10. The biosensor as claimed in claim 7, wherein a thickness of the flexible insulation layer is in a range of 0.05 to 1 mm, and a thickness of the resin layer is in a range of 0.001 to 0.1 mm.

11. The biosensor as claimed in claim 7, wherein the first metal layer, the second metal layer, the third metal layer and the fourth metal layer are formed by a plating method, and the plating method comprises a evaporation deposition method, a sputter deposition method, a chemical deposition method, or an electrolytic deposition method.

* * * * *